United States Patent
Wu et al.

(10) Patent No.: US 10,727,118 B2
(45) Date of Patent: Jul. 28, 2020

(54) METHOD FOR MANUFACTURING SEMICONDUCTOR DEVICE AND PRE-CLEAN APPARATUS FOR SEMICONDUCTOR DEVICE

(71) Applicant: TAIWAN SEMICONDUCTOR MANUFACTURING CO., LTD., Hsinchu (TW)

(72) Inventors: Jung-Tang Wu, Kaohsiung (TW); Pao-Sheng Chen, Tainan (TW); Pei-Hsuan Lee, Taipei (TW); Szu-Hua Wu, Zhubei (TW); Chih-Chien Chi, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/964,430

(22) Filed: Apr. 27, 2018

(65) Prior Publication Data
US 2019/0164826 A1    May 30, 2019

Related U.S. Application Data

(60) Provisional application No. 62/593,156, filed on Nov. 30, 2017.

(51) Int. Cl.
H01L 21/768    (2006.01)
H01L 21/67    (2006.01)
H01L 21/02    (2006.01)

(52) U.S. Cl.
CPC .. *H01L 21/76877* (2013.01); *H01L 21/02063* (2013.01); *H01L 21/02068* (2013.01); *H01L 21/67028* (2013.01)

(58) Field of Classification Search
None
See application file for complete search history.

(56) References Cited

U.S. PATENT DOCUMENTS

| 4,830,974 | A | * | 5/1989 | Chang | H01L 27/105 257/316 |
| 6,046,104 | A | * | 4/2000 | Kepler | H01L 21/76802 257/E21.577 |
| 6,048,766 | A | * | 4/2000 | Gardner | H01L 21/28273 257/E21.209 |
| 2002/0076837 | A1 | * | 6/2002 | Hujanen | B82Y 10/00 438/3 |
| 2006/0214305 | A1 | * | 9/2006 | Sakata | C23C 16/045 257/774 |
| 2010/0233876 | A1 | * | 9/2010 | Matsumoto | C23C 16/18 438/652 |

(Continued)

*Primary Examiner* — Anthony Ho
*Assistant Examiner* — Kevin Quinto
(74) *Attorney, Agent, or Firm* — Maschoff Brennan (57) ABSTRACT

In a method for manufacturing a semiconductor device, a substrate is provided. Various first metal layers are formed on the substrate. A dielectric structure with through holes is formed over the first metal layers. The through holes expose the first metal layers. A pre-clean operation is performed on the dielectric structure and the first metal layers by using an alcohol base vapor and/or an aldehyde base vapor as a reduction agent. Conductors are formed on the first metal layers. In forming the conductors, the through holes are filled with the conductors.

20 Claims, 8 Drawing Sheets

(56) References Cited

U.S. PATENT DOCUMENTS

| | | | | |
|---|---|---|---|---|
| 2012/0193807 A1* | 8/2012 | Chumakov | ............ | B82Y 10/00 |
| | | | | 257/774 |
| 2015/0243556 A1* | 8/2015 | Shimada | ........... | H01L 21/76882 |
| | | | | 438/652 |
| 2016/0064275 A1* | 3/2016 | Liu | ................... | H01L 21/76883 |
| | | | | 438/608 |

* cited by examiner

METHOD FOR MANUFACTURING SEMICONDUCTOR DEVICE AND PRE-CLEAN APPARATUS FOR SEMICONDUCTOR DEVICE

RELATED APPLICATIONS

This application claims priority to U.S. Provisional Application Ser. No. 62/593,156, filed Nov. 30, 2017, which is herein incorporated by reference.

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A through FIG. 1I are schematic views of intermediate stages showing a method for manufacturing a semiconductor device in accordance with various embodiments.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a process of manufacturing an interconnection structure of a semiconductor device, after through holes are formed in a dielectric layer to expose metal layers under the dielectric layer, a pre-clean operation is typically performed by using a pre-clean agent to remove oxide residuals, and then the interconnection structure is formed on the dielectric layer to fill the through holes with the interconnecting structure. However, the dielectric layer and/or the metal layers are easily damaged by the pre-clean agent, thus resulting in the leakage of the semiconductor device and the decay of conductivity of the metal layers.

Embodiments of the present disclosure are directed to providing a method for manufacturing a semiconductor device and a pre-clean apparatus for a semiconductor device, in which a pre-clean operation is performed by using alcohol base vapor and/or an aldehyde base vapor as a reduction agent, such that oxide film residues on a dielectric structure and metal layers are easily removed without damaging the metal layers, and thus increasing the conductivity of the metal layers. Furthermore, an amount of carbon chains on a surface of the dielectric structure is increased, thereby decreasing the leakage of the semiconductor device.

Figure 1A:
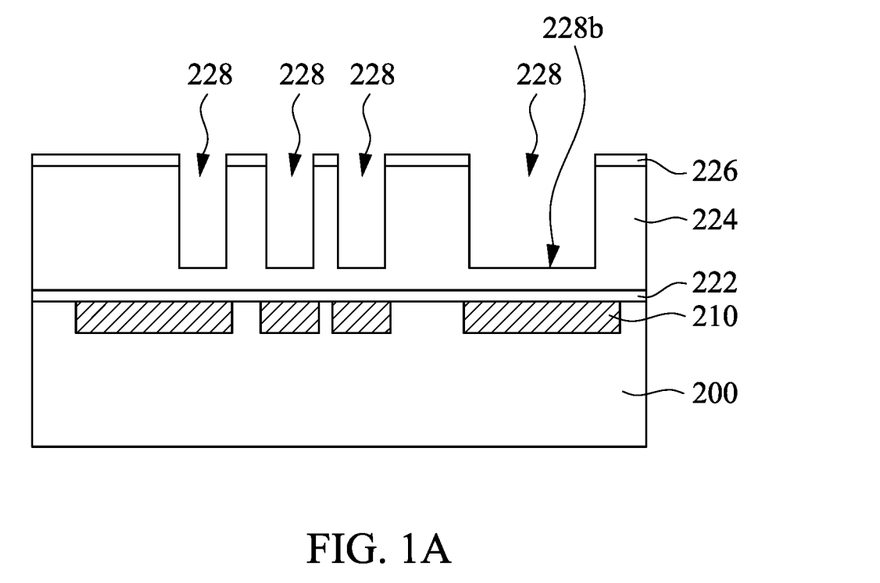

FIG. 1A through FIG. 1I are schematic views of intermediate stages showing a method for manufacturing a semiconductor device in accordance with various embodiments. As shown in FIG. 1A, a substrate 200 is provided. The substrate 200 may include a semiconductor base, one or more dielectric layers, and one or more interconnection layers. The dielectric layers and the interconnection layers are disposed over the semiconductor base, and the interconnection layers are disposed in the dielectric layers. The semiconductor base may be composed of a single-crystalline semiconductor material or a compound semiconductor material. For example, silicon, germanium or glass may be used as a material of the semiconductor base. The dielectric layers may include silicon oxide, silicon nitride, silicon oxynitride, low dielectric constant dielectric materials, or any combination thereof. The interconnection layers may be formed from copper, copper alloy, aluminum, aluminum alloy, cobalt, or cobalt alloy, or any combination thereof. In some examples, as shown in FIG. 1A, various first metal layers 210 are formed on the substrate 200. The first metal layers 210 may be one of the interconnection layers. For example, the first metal layers 210 may be formed from copper, copper alloy, aluminum, aluminum alloy, cobalt, or cobalt alloy, or any combination thereof.

Figure 1B:
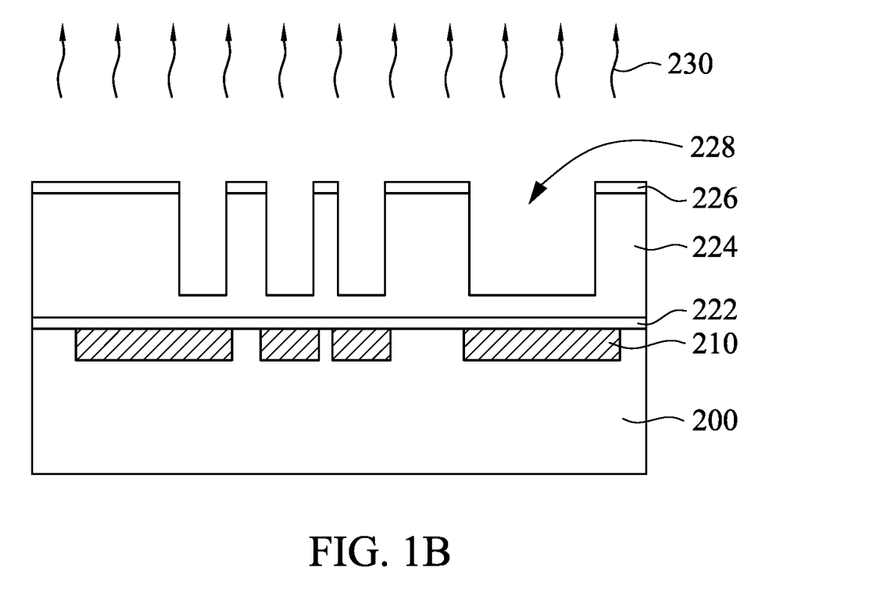
Figure 1C:
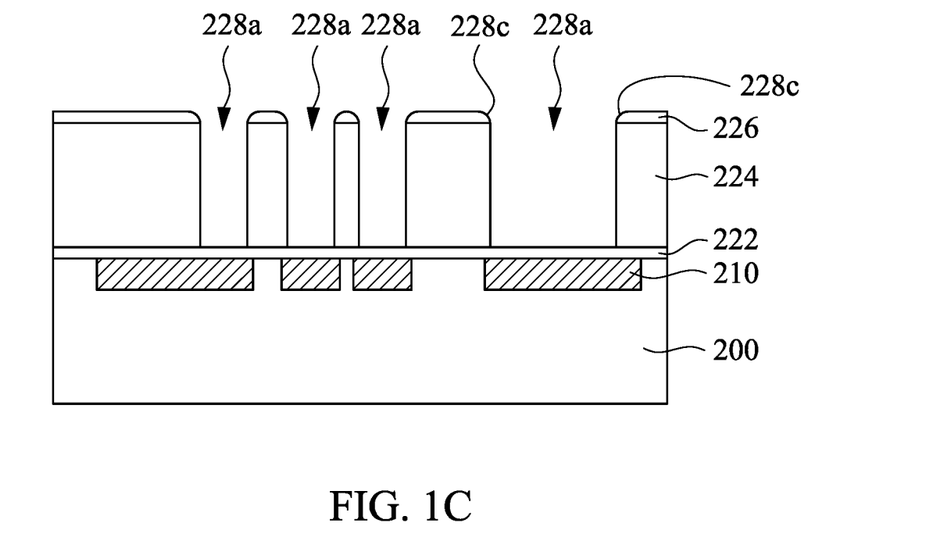
Figure 1D:
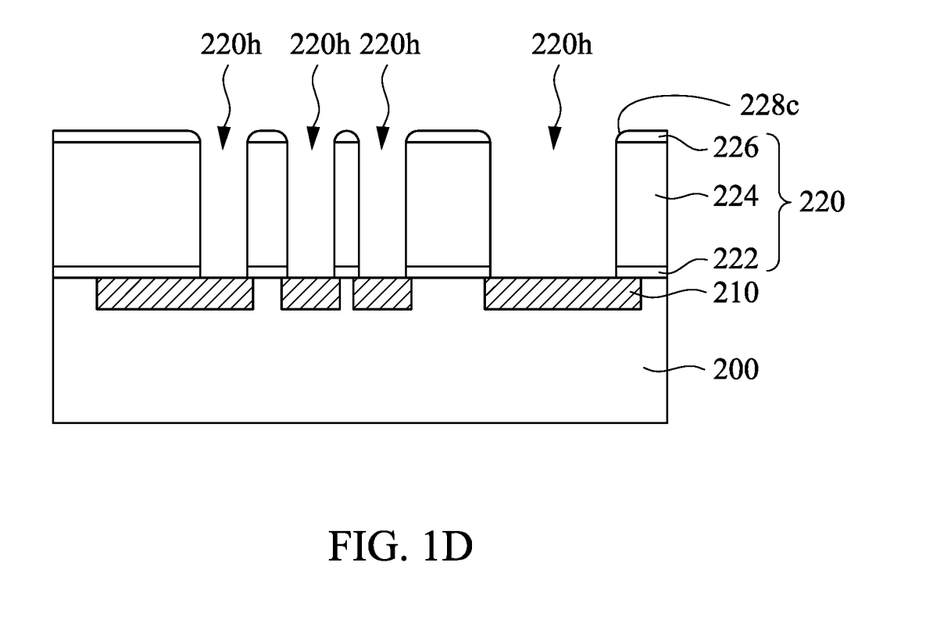

As shown in FIG. 1D, a dielectric structure 220 is formed over the first metal layers 210 on the substrate 200. The dielectric structure 220 is formed to include various through holes 220h. The through holes 220h pass through the dielectric structure 220, such that each of the through holes 220h extends from a top of the dielectric structure 220 to a bottom of the dielectric structure 220. The through holes 220h may respectively disposed over and expose the first metal layers 210.

In some examples, as shown in FIG. 1A, in forming the dielectric structure 220, a first dielectric layer 222 is formed to cover the first metal layers 210 and the substrate 200 by using a deposition process, such as a chemical vapor deposition (CVD) process, a physical vapor deposition (PVD) process, or plasma-enhanced chemical vapor deposition (PECVD) process. For example, the first dielectric layer 222 may be formed to be an etch stop layer, which provides a stop for a subsequent etch operation for forming the through holes 220h. The first dielectric layer 222 may include ethyl methyl methacrylate (EMMA) and/or aluminum oxide ($AlO_x$).

A second dielectric layer 224 is formed on the first dielectric layer 222 by using a deposition process, such as a chemical vapor deposition process, a physical vapor deposition process, or plasma-enhanced chemical vapor deposition process. For example, the second dielectric layer 224 may be formed from a low dielectric constant dielectric material. A third dielectric layer 226 is formed on the second dielectric layer 224 by using a deposition process, such as a chemical vapor deposition process, a physical vapor deposition process, or plasma-enhanced chemical vapor deposition process. In some exemplary examples, the third second dielectric layer 226 is formed to have an etch selectivity with respect to the second dielectric layer 224. For example, the third second dielectric layer 226 may be formed from tetraethoxysilane (TEOS).

Referring to FIG. 1A again, the third dielectric layer 226 and the second dielectric layer 224 are patterned. In patterning of the third dielectric layer 226 and the second dielectric layer 224, portions of the third dielectric layer 226 and portions of the second dielectric layer 224 are removed to form various holes 228 in the third dielectric layer 226 and the second dielectric layer 224. For example, patterning the third dielectric layer 226 and the second dielectric layer 224 may be performed by using a photolithography process and an etch process. In some exemplary examples, after the portions of the second dielectric layer 224 are removed, a bottom 228b of each of the holes 228 is located in the second dielectric layer 224, and the first dielectric layer 222 is still covered by the second dielectric layer 224 and is not exposed by the holes 228. Then, a hard mask (not shown) for patterning the third dielectric layer 226 and the second dielectric layer 224 may be removed from a top of the third dielectric layer 226 by a wet removal process. For example, the hard mask may be formed from titanium nitride (TaN).

In some exemplary examples, as shown in FIG. 1B, a bake operation may be performed to remove mist 230, which may remain in the third dielectric layer 226, the second dielectric layer 224, and the first dielectric layer 222. For example, the mist 230 may include solvent used in the wet removal process.

In some examples, as shown in FIG. 1C, a removal operation is performed to remove other portions of the second dielectric layer 224. The removal operation extends the holes 228 to form holes 228a in the third dielectric layer 226 and the second dielectric layer 224, in which the holes 228a expose portions of the first dielectric layer 222. For example, the removal operation may be performed by using an etch technique, such as a dry etch technique. In some exemplary examples, the third second dielectric layer 226 has an etch selectivity with respect to the second dielectric layer 224 during the removal operation, such that the removal operation further removes portions of the third dielectric layer 226 adjacent to the holes 228, so as to form each of the holes 228a having a round corner 228c.

In some examples, as shown in FIG. 1D, a wet clean operation is performed to remove the exposed portions of the first dielectric layer 222. During the wet clean operation, the holes 228a are extended to the first metal layers 210 to form the through holes 220h, so as to complete the dielectric structure 220. Thus, after the wet clean operation is completed, the through holes 220h pass through the dielectric structure 220 to respectively expose the first metal layers 210. Each of the through holes 220h is formed to have the round corner 228c. For example, the wet clean operation may be performed by using a wet etch technique. In some examples, during the wet clean operation, a lateral etch may occur on surfaces of the through holes 220h. Thus, portions of the second dielectric layer 224 may be etched during the wet etch operation.

Figure 1E:
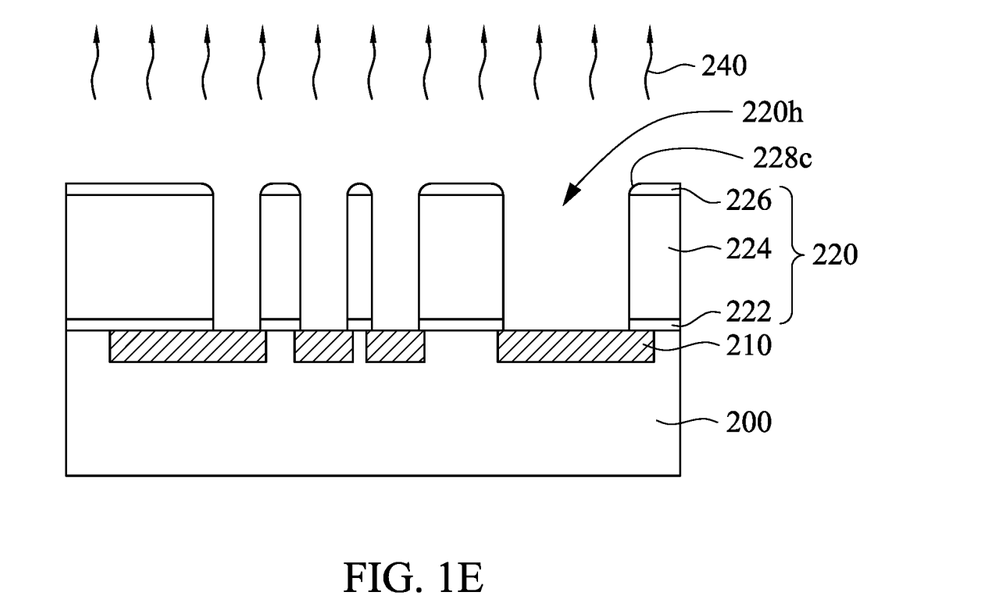

In some exemplary examples, as shown in FIG. 1E, a bake operation may be performed to remove mist 240 which may remain in the third dielectric layer 226, the second dielectric layer 224, and the first dielectric layer 222. For example, the mist 240 may include solvent used in the wet clean operation.

Figure 1F:
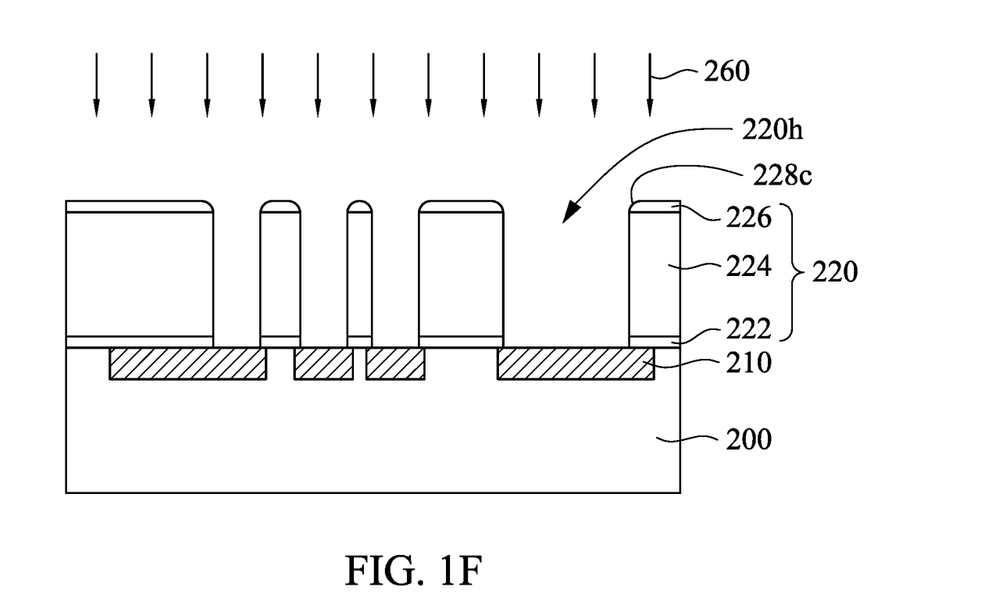
Figure 2A:
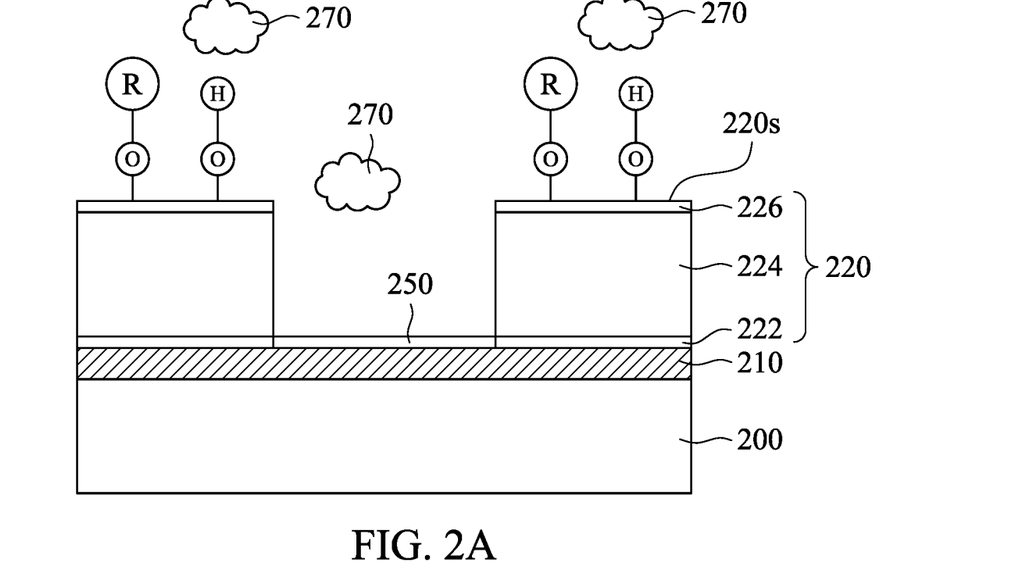
FIG. 2A and FIG. 2B are schematic views of intermediate stages showing a pre-clean operation of a semiconductor device in accordance with various embodiments.
Figure 2B:
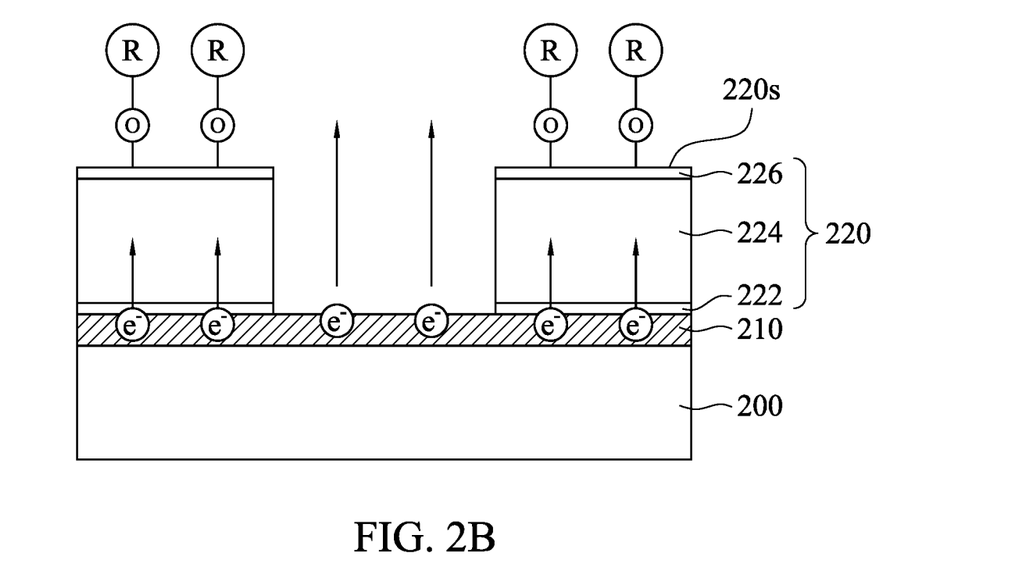

Referring to FIG. 1F, FIG. 2A and FIG. 2B. FIG. 2A and FIG. 2B are schematic views of intermediate stages showing a pre-clean operation of a semiconductor device in accordance with various embodiments. After the aforementioned operations, there may be various oxide film residues 250 on the dielectric structure 220 and/or the first metal layers 210. For example, as shown in FIG. 2A, the oxide film residues 250 may remain on the first metal layers 210. The oxide film residues 250 may include metal oxide. For example, the oxide film residues 250 may include copper oxide, cobalt oxide, aluminum oxide, or any combination thereof. In some examples, as shown in FIG. 1F, a pre-clean operation 260 is performed on the dielectric structure 220 and the first metal layers 210 to remove the oxide film residues 250 on the dielectric structure 220 and/or the first metal layers 210. In some exemplary examples, the pre-clean operation 260 is performed by using an alcohol base vapor and/or an aldehyde base vapor as a reduction agent 270. For example, the alcohol base vapor may include methanol, propanol, butanol, or any combination thereof, and the aldehyde base vapor may include formaldehyde, acetaldehyde, propionaldehyde, or any combination thereof. In some exemplary examples, the pre-clean operation 260 may use a carrier gas to carry the reduction agent 270. For example, the carrier gas may include nitrogen, argon, helium, or any combination thereof.

The reduction agent 270 including alcohol base vapor and the aldehyde base vapor reacts with the oxide film residues 250 without damaging the first metal layers 210, such that the oxide film residues 250 are effectively decomposed and removed while the first metal layers 210 are kept. Furthermore, in forming the dielectric structure 220, various —OH groups and carbon chains R may be formed on a surface 220s of the dielectric structure 220, as shown in FIG. 2A. For example, the carbon chains R may include —$CH_3$, —$C_2H_5$, and/or —$C_3H_7$. Referring to FIG. 2A and FIG. 2B simultaneously, the carbon chains R originally formed on the surface 220s of the dielectric structure 220 may not be replaced during the pre-clean operation 260. The pre-clean operation 260 may replace hydrogen atoms in the —OH groups with carbon chains R of the alcohol base vapor and the aldehyde base vapor in the reduction agent 270. Accordingly, after the pre-clean operation 260 is completed, the hydrogen atoms in the —OH groups originally formed on the surface 220s of the dielectric structure 220 are replaced with the carbon chains R in the reduction agent 270, such that an amount of the carbon chains R on the surface 220s of the dielectric structure 220 may be increased.

In some exemplary examples, the oxide film residues 250 include copper oxide, the material of the dielectric structure 220 includes silicon dioxide, and the reduction agent 270 includes ethanol. The reactions between the reduction agent 270 and the oxide film residues 250 are described by the following equations:

$$12CuO_{(s)} + CH_3CH_2OH_{(g)} \rightarrow 6Cu_2O_{(s)} + 2Co_{2(g)} + 3H_2O_{(g)};$$

$$6Cu_2O_{(s)} + CH_3CH_2OH_{(g)} \rightarrow 12Cu_{(s)} + 2CO_{2(g)} 3H_2O_{(g)}.$$

The reaction of the hydrogen atoms in the —OH groups on the surface 220s of the dielectric structure 220 being replaced with the carbon chains R of the ethanol in the reduction agent 270 is described by the following equation:

$$SiO_2-OH + CH_3CH_2OH_{(g)} \rightarrow SiO_2-OCH_2CH_3 + H_2O_{(g)}.$$

Molecular groups of the carbon chains R are larger than the hydrogen atoms in the —OH groups, such that electrons in the substrate 200, the first metal layers 210, and the dielectric structure 220 are blocked by the carbon chains R on the surface 220s of the dielectric structure 220, thereby decreasing the leakage.

Figure 1G:
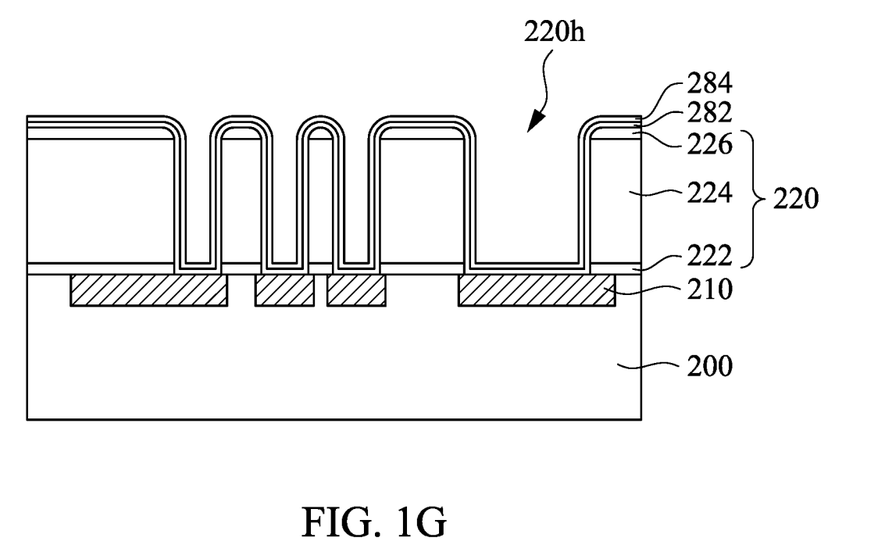
Figure 1H:
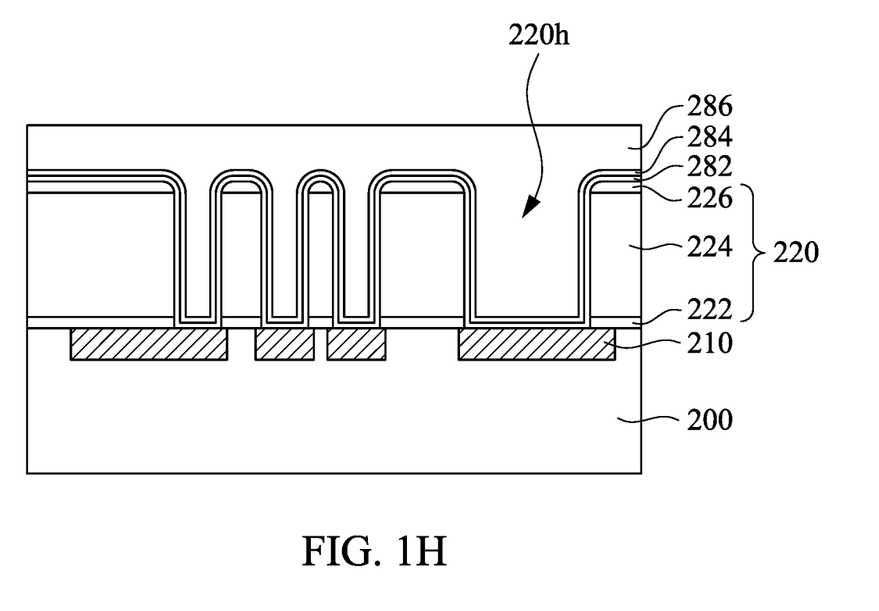
Figure 1I:
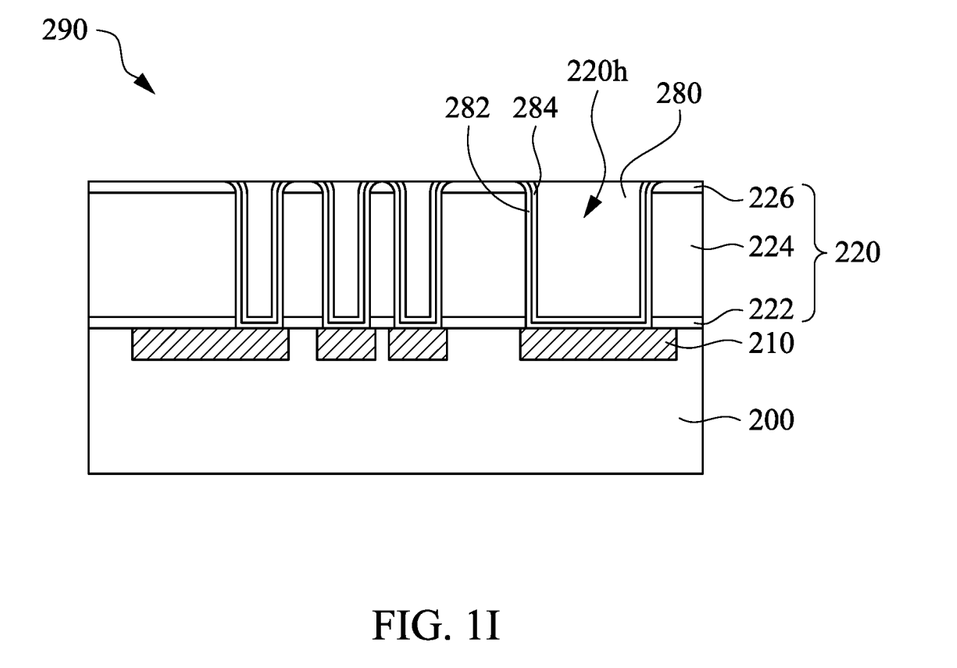

Referring to FIG. 1I, conductors 280 are formed on the first metal layers 210, and the through holes 220h are respectively filled with the conductors 280 to complete a semiconductor device 290. The conductors 280 may be vias of a back-end of the line (BEOL). For example, the conductors 280 may be formed from copper, copper alloy, aluminum, aluminum alloy, cobalt, or cobalt alloy, or any combination thereof. In some examples, as shown in FIG. 1G, between the pre-clean operation 260 and forming the conductors 280, a barrier layer 282 may be optionally formed to cover the first dielectric layer 222, the second dielectric layer 224, the third dielectric layer 226, and the first metal layers 210. For example, the barrier layer 282 may be formed by using a chemical vapor deposition technique or a physical vapor deposition technique. In some exemplary examples, the barrier layer 282 may be formed to conformally cover the dielectric structure 220 and the first metal layers 210. For example, the barrier layer 290 may be formed from tantalum nitride. Optionally, a base layer 284 may be formed to cover the barrier layer 282. For example, forming the base layer 284 may be performed by using a chemical vapor deposition technique, a physical vapor deposition technique, or an electroless plating technique. In some exemplary examples, the base layer 284 may be formed to conformally cover the barrier layer 282.

As shown in FIG. 1H, after the base layer 284 is completed, a second metal layer 286 may be formed on the base layer 284 and the dielectric structure 220 by using, for example, an electroplating operation. The through holes 220h are filled with the second metal layer 286. In the electroplating operation, the base layer 284 may be used as a seed layer. The base layer 284 may be formed from a material which is the same with the second metal layer 286.

As shown in FIG. 1I, portions of the second metal layer 286, the base layer 284, and the barrier layer 282 that are located over the dielectric structure 220 are removed, so as to form the conductors 280 in the through holes 220h respectively. The portions of the second metal layer 286, the base layer 284, and the barrier layer 282 may be removed by using a polishing technique. In some exemplary examples, the polishing technique is a chemical mechanical polishing technique.

Figure 3:
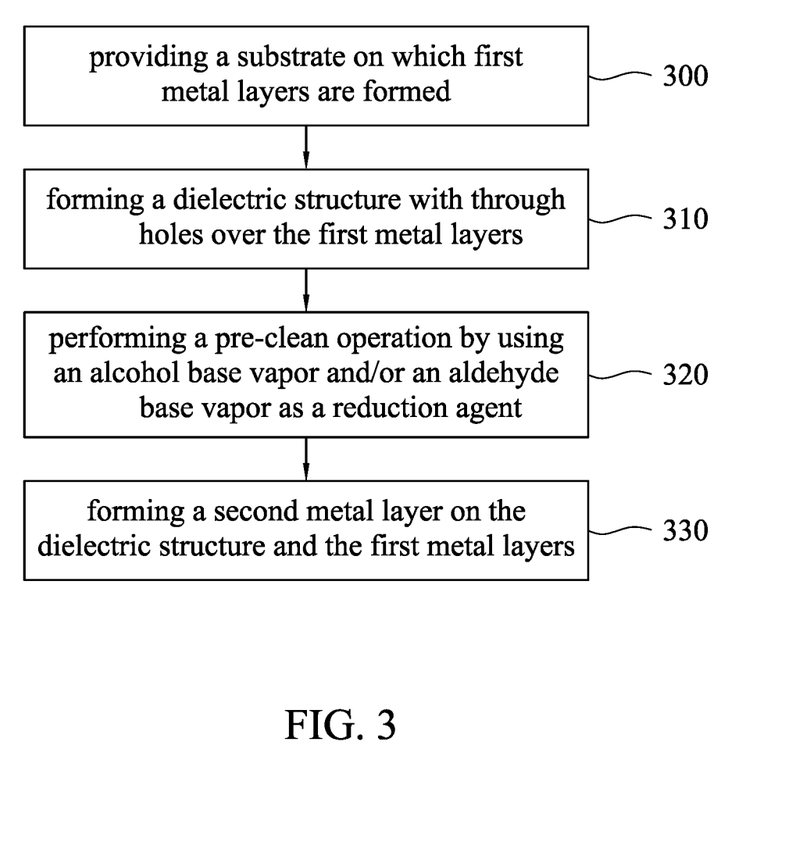
FIG. 3 is a flow chart of a method for manufacturing a semiconductor device in accordance with various embodiments.

Referring to FIG. 3 with FIG. 1A through FIG. 1I, FIG. 2A and FIG. 2B, FIG. 3 is a flow chart of a method for manufacturing a semiconductor device in accordance with various embodiments. The method begins at operation 300, where a substrate 200 is provided, as shown in FIG. 1A. The substrate 200 may include a semiconductor base, one or more dielectric layers, and one or more interconnection layers. The dielectric layers and the interconnection layers are disposed over the semiconductor base, and the interconnection layers are disposed in the dielectric layers. In some examples, as shown in FIG. 1A, various first metal layers 210 are formed on the substrate 200. The first metal layers 210 may be one of the interconnection layers.

At operation 310, as shown in FIG. 1D, a dielectric structure 220 is formed over the first metal layers 210 on the substrate 200. The dielectric structure 220 is formed to include various through holes 220h. Each of the through holes 220h extends from a top of the dielectric structure 220 to a bottom of the dielectric structure 220. The through holes 220h may respectively disposed over and expose the first metal layers 210.

In some examples, in forming the dielectric structure 220, a first dielectric layer 222 is formed to cover the first metal layers 210 and the substrate 200 by using, for example, a chemical vapor deposition process, a physical vapor deposition process, or plasma-enhanced chemical vapor deposition process. For example, the first dielectric layer 222 may be an etch stop layer, which provides a stop for a subsequent etch operation for forming the through holes 220h. A second dielectric layer 224 is formed on the first dielectric layer 222 by using, for example, a chemical vapor deposition process, a physical vapor deposition process, or plasma-enhanced chemical vapor deposition process. For example, the second dielectric layer 224 may be formed from a low dielectric constant dielectric material. The second dielectric layer 224 has an etch selectivity with respect to the first dielectric layer 222. A third dielectric layer 226 is formed on the second dielectric layer 224 by using, for example, a chemical vapor deposition process, a physical vapor deposition process, or plasma-enhanced chemical vapor deposition process. In some exemplary examples, the third second dielectric layer 226 has an etch selectivity with respect to the second dielectric layer 224.

In some examples, as shown in FIG. 1A, the third dielectric layer 226 and the second dielectric layer 224 are patterned by removing portions of the third dielectric layer 226 and portions of the second dielectric layer 224 using, for example, a photolithography process and an etch process. The third dielectric layer 226 and the second dielectric layer 224 are patterned to form various holes 228 in the third dielectric layer 226 and the second dielectric layer 224. In some exemplary examples, after the portions of the second dielectric layer 224 are removed, a bottom 228b of each of the holes 228 is located in the second dielectric layer 224, and the first dielectric layer 222 is still covered by the second dielectric layer 224. Then, a hard mask (not shown) for patterning the third dielectric layer 226 and the second dielectric layer 224 may be removed from a top of the third dielectric layer 226 by, for example, a wet removal process.

As shown in FIG. 1B, a bake operation may be optionally performed to remove mist 230 remaining in the third dielectric layer 226, the second dielectric layer 224, and the first dielectric layer 222. The mist 230 may include solvent used in the wet removal process.

In some examples, as shown in FIG. 1C, a removal operation is performed on the second dielectric layer 224 by using an etch technique, such as a dry etch technique. The removal operation removes other portions of the second dielectric layer 224 to extend the holes 228 to form holes 228a. The holes 228a respectively expose portions of the first dielectric layer 222. The removal operation further removes portions of the third dielectric layer 226 to form each of the holes 228a having a round corner 228c.

In some examples, as shown in FIG. 1D, a wet clean operation is performed to remove the exposed portions of the first dielectric layer 222 by using, for example, a wet etch technique. The holes 228a are extended to the first metal layers 210 to form the through holes 220h, so as to complete the dielectric structure 220. The through holes 220h pass through the dielectric structure 220 to respectively expose the first metal layers 210. Each of the through holes 220h is formed to have the round corner 228c.

Optionally, as shown in FIG. 1E, a bake operation may be performed to remove mist 240 remaining in the third dielectric layer 226, the second dielectric layer 224, and the first dielectric layer 222. The mist 240 may include solvent used in the wet clean operation.

After the aforementioned operations, there may be various oxide film residues 250 on the dielectric structure 220 and/or the first metal layers 210. For example, as shown in FIG. 2A, the oxide film residues 250 may remain on the first metal layers 210. For example, the oxide film residues 250 may be metal oxides, which may include copper oxide, cobalt oxide, or aluminum oxide.

At operation 320, as shown in FIG. 1F, a pre-clean operation 260 is performed on the dielectric structure 220 and the first metal layers 210 to remove the oxide film residues 250 on the dielectric structure 220 and/or the first metal layers 210. In some exemplary examples, the pre-clean operation 260 is performed by using an alcohol base vapor and/or an aldehyde base vapor as a reduction agent 270. For example, the alcohol base vapor may include methanol, propanol, butanol, or any combination thereof, and the aldehyde base vapor may include formaldehyde, acetaldehyde, propionaldehyde, or any combination thereof. In some exemplary examples, the pre-clean operation 260 may use a carrier gas to carry the reduction agent 270. The carrier gas may include nitrogen, argon, helium, or any combination thereof.

The alcohol base vapor and the aldehyde base vapor can react with the oxide film residues 250 without damaging the first metal layers 210, such that the oxide film residues 250 can be effectively decomposed and removed while the first metal layers 210 are kept. Furthermore, as shown in FIG. 2A, in forming the dielectric structure 220, various —OH groups and carbon chains R may be formed on a surface 220s of the dielectric structure 220. Referring to FIG. 2A and FIG. 2B simultaneously, the pre-clean operation 260 may replace hydrogen atoms in the —OH groups with carbon chains R of the reduction agent 270, while the carbon chains R originally formed on the surface 220s of the dielectric structure 220 may be kept, such that an amount of the carbon chains R on the surface 220s of the dielectric structure 220 may be increased after the pre-clean operation 260.

At operation 330, as shown in FIG. 1I, conductors 280 are formed on the first metal layers 210, and the through holes 220h are respectively filled with the conductors 280 to complete a semiconductor device 290. The conductors 280 may be vias of a back-end of the line. As shown in FIG. 1G, before forming the conductors 280, a barrier layer 282 may be optionally formed to cover the first dielectric layer 222, the second dielectric layer 224, the third dielectric layer 226, and the first metal layers 210, by using, for example, a chemical vapor deposition technique or a physical vapor deposition technique. For example, the barrier layer 282 may be formed to conformally cover the dielectric structure 220 and the first metal layers 210. Optionally, a base layer 284 may be formed to cover the barrier layer 282 by using, for example, a chemical vapor deposition technique, a physical vapor deposition technique, or an electroless plating technique. For example, the base layer 284 may be formed to conformally cover the barrier layer 282.

As shown in FIG. 1H, a second metal layer 286 may be formed on the base layer 284 and the dielectric structure 220 by using, for example, an electroplating operation. The through holes 220h are filled with the second metal layer 286. In the electroplating operation, the base layer 284 may be used as a seed layer.

As shown in FIG. 1I, portions of the second metal layer 286, the base layer 284, and the barrier layer 282 that are located over the dielectric structure 220 are removed, so as to form the conductors 280 in the through holes 220h respectively. The portions of the second metal layer 286, the base layer 284, and the barrier layer 282 may be removed by using a polishing technique, for example a chemical mechanical polishing technique.

Figure 4:
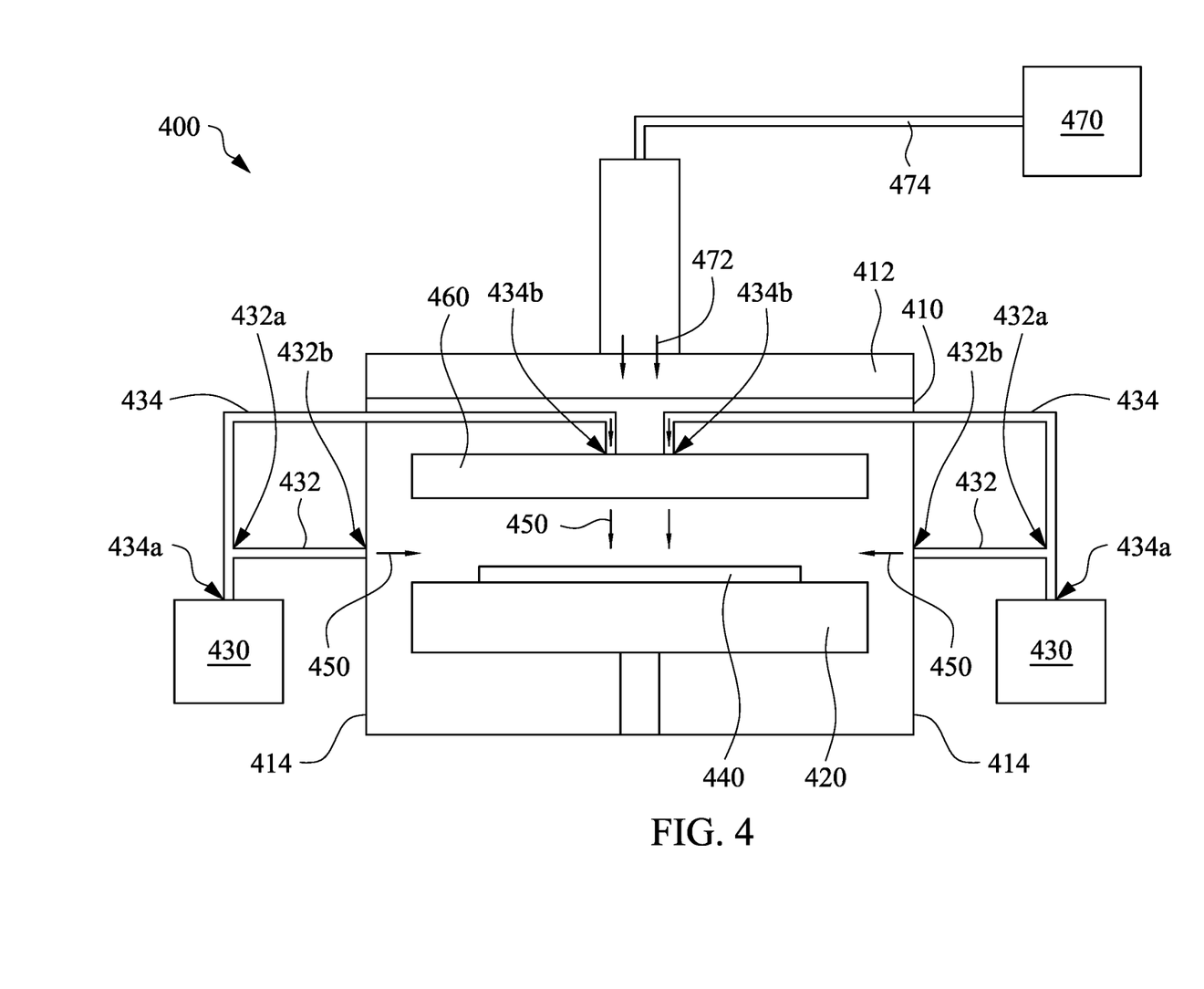
FIG. 4 is schematic drawing of pre-clean apparatus for a semiconductor device in accordance with various embodiments.

FIG. 4 is schematic drawing of pre-clean apparatus for a semiconductor device in accordance with various embodiments. The pre-clean apparatus 400 can be used to perform a pre-clean operation of a semiconductor device, such as the pre-clean operation 260 shown in FIG. 1F. In some examples, the pre-clean apparatus 400 includes a chamber 410, a heating pedestal 420, and at least one vapor supply, such as vapor supplies 430. The pre-clean operation is performed within the chamber 410. The chamber 410 may include a lid 412 on a top of the chamber 410. The chamber 410 has two opposite sidewalls 414.

The heating pedestal 420 is disposed within the chamber 410. The heating pedestal 420 is configured to carry and hold the semiconductor device 440, and heat the semiconductor device 440 in the pre-clean operation. In some exemplary examples, the heating pedestal 420 may include an electrostatic chuck (E-chuck), which can hold the semiconductor device 440 during the pre-clean operation.

Each of the vapor supplies 430 contains a reduction agent 450 for pre-cleaning. In some examples, the reduction agent 450 includes an alcohol base vapor and/or an aldehyde base vapor. Each of the vapor supplies 430 is connected to the chamber 410 via one or more lines 432 and 434. In some examples, each of the lines 434 has two openings 434a and 434b, in which the opening 434a is connected to one of the vapor supplies 430, and the other opening 434b is located over the semiconductor device 440 within the chamber 410. Each of the lines 432 has two openings 432a and 432b, in which the opening 432a is connected to one of the lines 434, and the other opening 432b is located in one of the sidewalls 414 and is located at the periphery of the semiconductor device 440. The openings 432b of the lines 432 may be slightly higher than a top of the semiconductor device 440. The vapor supplies 430 are configured to supply the reduction agent 450 to the chamber 410 via the lines 432 and/or 434, such that the reduction agent 450 can be used to pre-clean the semiconductor device 440 held on the heating pedestal 420 to remove oxide film residues from the semiconductor device 440. For example, the alcohol base vapor may include methanol, propanol, butanol, or any combination thereof, and the aldehyde base vapor may include formaldehyde, acetaldehyde, propionaldehyde, or any combination thereof. In some exemplary examples, as shown in FIG. 4, each of the vapor supplies 430 is a vessel. In certain examples, each of the vapor supplies 430 includes at least one vessel. For example, each of the vapor supplies 430 may include a vapor drop type vessel and/or a bubbler type vessel.

In some exemplary examples, a pressure of each of the vapor supplies 430 may be substantially controlled in a range from 0 torr to 100 torr. A temperature of each of the vapor supplies 430 may be substantially smaller than 198 degrees centigrade. A temperature of each of the lines 432 and 434 may be substantially greater than 20 degrees centigrade.

Referring to FIG. 4 again, the pre-clean apparatus 400 may optionally include a spray head 460. The spray head 460 is disposed within the chamber 410 over the semiconductor device 440 on the heating pedestal 420. The spray head 460 is connected to at least one of the vapor supplies 430 via at least one of the lines 434. For example, the spray head 460 is connected to the vapor supplies 430 via the lines 434 respectively. The opening 434a of each line 434 is connected to the vapor supply 430, and the other opening 434b of each line 434 is connected to the spray head 460. The vapor supplies 430 supply the reduction agent 450 to the spray head 460 via the lines 434, and the spray head 460 is configured to deliver the reduction agent 450 from the vapor supplies 430 toward the semiconductor device 440 held on the heating pedestal 420. The spray head 460 may uniformly distribute the reduction agent 450 toward the semiconductor device 440. The reduction agent 450 may also be delivered to the chamber 410 via the lines 432, such that the reduction agent 450 may be introduced toward the semiconductor device 440 from the periphery of the semiconductor device 440.

In some examples, as shown in FIG. 4, the pre-clean apparatus 400 further includes a hydrogen radical supply 470. For example, the hydrogen radical supply 470 may be a hydrogen plasma supply, which supplies hydrogen radicals 472. In some exemplary examples, the hydrogen radical supply 470 is connected to the chamber 410 via a line 474, and the line 474 is connected to the chamber 410 through the lid 412 of the chamber 410. The hydrogen radical supply 470 delivers the hydrogen radicals 472 to the chamber 410 via the line 474, such that the hydrogen radicals 472 are dispensed from the lid 412 toward the semiconductor device 440. The hydrogen radicals 472 may be used as a reduction agent, such that the hydrogen radicals 472 may be used to pre-clean the semiconductor device 440 together with the reduction agent 450.

In performing the pre-clean operation on the semiconductor device 440, the semiconductor device 440 is loaded into the chamber 410 and is put on the heating pedestal 420. The semiconductor device 440 is held and heated by the heating pedestal 420. For example, a temperature of the heating pedestal 420 may be substantially controlled in a range from 20 degrees centigrade to 80 degrees centigrade. A pressure of the chamber 410 may be substantially controlled in a range from 0 torr to 100 torr. The vapor supplies 430 supply the reduction agent 450, and the alcohol base vapor and/or the aldehyde base vapor of the reduction agent 450 may be mixed by using a mixer. Then, the reduction agent 450 may be delivered into the chamber 410 through the lines 432, and/or the lines 434 and the spray head 460 to pre-clean the semiconductor device 440. In certain examples, hydrogen radical supply 470 may supply the hydrogen radicals 472 into the chamber 410 via the line 474. A carrier gas may be used to carry the reduction agent 450. For example, the carrier gas may include nitrogen, argon, helium, or any combination thereof.

The alcohol base vapor and the aldehyde base vapor of the reduction agent 450 react with oxide film residues on the semiconductor device 440 without damaging metal layers of the semiconductor device 440, such that the oxide film residues are effectively decomposed and removed. During the pre-clean operation, carbon chains of the reduction agent 450 may replace hydrogen atoms in —OH groups on the semiconductor device, while the carbon chains originally formed on the semiconductor device 440 may be kept, such that an amount of the carbon chains on the semiconductor device 440 may be increased.

In accordance with an embodiment, the present disclosure discloses a method for manufacturing a semiconductor device. In this method, a substrate is provided. Various first metal layers are formed on the substrate. A dielectric structure with various through holes is formed over the first metal layers. The through holes expose the first metal layers. A pre-clean operation is performed on the dielectric structure and the first metal layers by using an alcohol base vapor and/or an aldehyde base vapor as a reduction agent. Conductors are formed on the first metal layers. Forming the conductors includes filling the through holes with the conductors respectively.

In accordance with one embodiment, performing the pre-clean operation includes removing oxide film residues on the dielectric structure and the first metal layers.

In accordance with one embodiment, the oxide film residues includes copper oxide, cobalt oxide, aluminum oxide, or any combination thereof.

In accordance with one embodiment, the alcohol base vapor includes methanol, propanol, butanol, or any combination thereof.

In accordance with one embodiment, the aldehyde base vapor includes formaldehyde, acetaldehyde, propionaldehyde, or any combination thereof.

In accordance with one embodiment, performing the pre-clean operation uses a carrier gas, and the carrier gas includes nitrogen, argon, helium, or any combination thereof.

In accordance with one embodiment, between performing the pre-clean operation and forming the conductors, the method further includes forming a barrier layer to cover the dielectric structure and the first metal layers, and forming a base layer to cover the barrier layer.

In accordance with one embodiment, forming the dielectric structure includes forming various —OH groups on a surface of the dielectric structure, and performing the pre-clean operation includes replacing hydrogen atoms in the —OH groups with carbon chains of the reduction agent.

In accordance with another embodiment, the present disclosure discloses a method for manufacturing a semiconductor device. In this method, a substrate is provided. Various first metal layers are formed on the substrate. Various dielectric layers are stacked over the first metal layers sequentially. Various through holes are formed in the dielectric layers. The through holes are formed to expose the first metal layers. A pre-clean operation is performed to remove oxide film residues on the dielectric layers and the first metal layers. Performing the pre-clean operation uses an alcohol base vapor and/or an aldehyde base vapor as a reduction agent. Conductors are formed on the first metal layers. Forming the conductors includes filling the through holes with the conductors respectively.

In accordance with one embodiment, in forming the dielectric layers, a first dielectric layer is formed on the substrate, in which the first dielectric layer is formed to be an etch stop layer. A second dielectric layer is formed on the first dielectric layer, in which the second dielectric layer is formed from a low dielectric constant dielectric material. A third dielectric layer is formed on the second dielectric layer, in which the third second dielectric layer is formed to have an etch selectivity with respect to the second dielectric layer.

In accordance with one embodiment, forming the through holes comprises forming each of the through holes having a round corner.

In accordance with one embodiment, forming the through holes further includes performing a wet clean operation on the dielectric layers. After forming the through holes, the method further includes performing a bake operation on the dielectric layers and the first metal layers.

In accordance with one embodiment, the alcohol base vapor includes methanol, propanol, butanol, or any combination thereof, and the aldehyde base vapor includes formaldehyde, acetaldehyde, propionaldehyde, or any combination thereof.

In accordance with one embodiment, performing the pre-clean operation uses a carrier gas, and the carrier gas includes nitrogen, argon, helium, or any combination thereof.

In accordance with one embodiment, the oxide film residues include metal oxide.

In accordance with one embodiment, forming the dielectric layers includes form various —OH groups on a top surface of the dielectric layers. Performing the pre-clean operation includes replacing hydrogen atoms in the —OH groups with carbon chains of the reduction agent.

In accordance with one embodiment, between performing the pre-clean operation and forming the conductors, the method further includes forming a barrier layer to cover the dielectric layers and the first metal layers, and forming a base layer to cover the barrier layer.

In accordance with yet another embodiment, the present disclosure discloses a pre-clean apparatus for a semiconductor device. The pre-clean apparatus includes a chamber, a heating pedestal, and a vapor supply. The heating pedestal is disposed within the chamber and is configured to carry a semiconductor device. The vapor supply is connected to the chamber via a line and is configured to supply a reduction agent into the chamber via the line to pre-clean the semiconductor device held on the heating pedestal. The reduction agent includes an alcohol base vapor and/or an aldehyde base vapor.

In accordance with one embodiment, the pre-clean apparatus further includes a spray head disposed within the chamber and connected to the line, in which the spray head is configured to deliver the reduction agent from the vapor supply toward the semiconductor device held on the heating pedestal.

In accordance with one embodiment, the vapor supply includes at least one vessel, and the at least one vessel includes a vapor drop type vessel and/or a bubbler type vessel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, the method comprising:
    transferring a substrate on which a plurality of first metal layers are formed into a chamber;
    forming a dielectric structure with a plurality of through holes over the first metal layers, wherein the through holes expose the first metal layers and forming the dielectric structure includes:
        partially etching the dielectric structure, wherein the first metal layers remain covered by a bottom portion of the dielectric structure after the partially etching is complete;
        removing mist from the bottom portion of the dielectric structure; and
        etching the bottom portion of the dielectric structure to form the through holes;
    introducing a reduction agent that comprises an alcohol base vapor and/or an aldehyde base vapor into the chamber through a line that extends through a sidewall of the chamber to perform a pre-clean operation on the dielectric structure and the first metal layers; and
    forming a plurality of conductors on the first metal layers, wherein forming the conductors comprises filling the through holes with the conductors respectively.

2. The method of claim 1, wherein performing the pre-clean operation comprises removing oxide film residues on the dielectric structure and the first metal layers.

3. The method of claim 2, wherein the oxide film residues comprises copper oxide, cobalt oxide, aluminum oxide, or any combination thereof.

4. The method of claim 1, wherein the alcohol base vapor comprises methanol, propanol, butanol, or any combination thereof.

5. The method of claim 1, wherein the aldehyde base vapor comprises formaldehyde, acetaldehyde, propionaldehyde, or any combination thereof.

6. The method of claim 1, wherein performing the pre-clean operation uses a carrier gas, and the carrier gas comprises nitrogen, argon, helium, or any combination thereof.

7. The method of claim 1, wherein between performing the pre-clean operation and forming the conductors, the method further comprises:
    forming a barrier layer to cover the dielectric structure and the first metal layers; and
    forming a base layer to cover the barrier layer.

8. The method of claim 1, wherein
    forming the dielectric structure comprises forming a plurality of —OH groups on a surface of the dielectric structure; and
    performing the pre-clean operation comprises replacing hydrogen atoms in the —OH groups with carbon chains of the reduction agent.

9. A method for manufacturing a semiconductor device, the method comprising:
    providing a substrate on which a plurality of first metal layers are formed;
    forming a plurality of dielectric layers stacked over the first metal layers sequentially;
    forming a plurality of through holes in the dielectric layers to form a dielectric structure, wherein the through holes are formed to expose the first metal layers and forming the through holes includes:
  etching a top portion of the dielectric structure such that a bottom portion of the dielectric structure covers the first metal layers;
  removing mist from the bottom portion of the dielectric structure; and
  etching the bottom portion of the dielectric structure to form the through holes;
performing a pre-clean operation to remove oxide film residues on the dielectric layers and the first metal layers, wherein performing the pre-clean operation uses an alcohol base vapor and/or an aldehyde base vapor as a reduction agent; and
forming a plurality of conductors on the first metal layers, wherein forming the conductors comprises filling the through holes with the conductors respectively.

10. The method of claim 9, wherein forming the dielectric layers comprises:
  forming a first dielectric layer on the substrate, wherein the first dielectric layer is formed to be an etch stop layer;
  forming a second dielectric layer on the first dielectric layer, wherein the second dielectric layer is formed from a low dielectric constant dielectric material; and
  forming a third dielectric layer on the second dielectric layer, wherein the third dielectric layer is formed to have an etch selectivity with respect to the second dielectric layer.

11. The method of claim 9, wherein forming the through holes comprises forming each of the through holes having a round corner.

12. The method of claim 9, wherein forming the through holes further comprises performing a wet clean operation on the dielectric layers; and
  after forming the through holes, the method further comprises performing a bake operation on the dielectric layers and the first metal layers.

13. The method of claim 9, wherein
  the alcohol base vapor comprises methanol, propanol, butanol, or any combination thereof; and
  the aldehyde base vapor comprises formaldehyde, acetaldehyde, propionaldehyde, or any combination thereof.

14. The method of claim 9, wherein performing the pre-clean operation uses a carrier gas, and the carrier gas comprises nitrogen, argon, helium, or any combination thereof.

15. The method of claim 9, wherein the oxide film residues comprise metal oxide.

16. The method of claim 9, wherein
  forming the dielectric layers comprises forming a plurality of —OH groups on a top surface of the dielectric layers; and
  performing the pre-clean operation comprises replacing hydrogen atoms in the —OH groups with carbon chains of the reduction agent.

17. The method of claim 16, wherein between performing the pre-clean operation and forming the conductors, the method further comprises:
  forming a barrier layer to cover the dielectric layers and the first metal layers; and
  forming a base layer to cover the barrier layer.

18. A method for manufacturing a semiconductor device, the method comprising:
  forming a metal layer on a substrate;
  forming a dielectric structure over the substrate and the metal layer;
  performing an etching process to form holes in the dielectric structure, wherein the etching process stops before the metal layer is exposed;
  after the etching process, removing mist from the dielectric structure;
  after removing the mist, deepening the holes in the dielectric structure to expose the metal layer; and
  after deepening the holes in the dielectric structure, forming a conductor in the holes in the dielectric structure and in contact with the metal layer.

19. The method of claim 18, wherein removing the mist is performed by using a bake operation.

20. The method of claim 18, further comprising:
  after deepening the holes in the dielectric structure and prior to forming the conductor, introducing a reduction agent that comprises an alcohol base vapor to perform a pre-clean operation on the dielectric structure and the metal layer.

* * * * *